United States Patent

Chiang et al.

(10) Patent No.: US 9,626,472 B2
(45) Date of Patent: Apr. 18, 2017

(54) METHOD AND SYSTEM OF FORMING LAYOUT DESIGN

(71) Applicant: TAIWAN SEMICONDUCTOR MANUFACTURING COMPANY, LTD., Hsinchu (TW)

(72) Inventors: Ting-Wei Chiang, New Taipei (TW); Li-Chun Tien, Tainan (TW); Hui-Zhong Zhuang, Kaohsiung (TW); Zhe-Wei Jiang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/555,175

(22) Filed: Nov. 26, 2014

(65) Prior Publication Data

US 2016/0147927 A1 May 26, 2016

(51) Int. Cl.
*G06F 17/50* (2006.01)
*H01L 27/088* (2006.01)

(52) U.S. Cl.
CPC ...... *G06F 17/5072* (2013.01); *H01L 27/0886* (2013.01)

(58) Field of Classification Search
CPC .. G06F 17/50; G06F 17/5072; G06F 2217/12; H01L 27/0886
See application file for complete search history.

(56) References Cited

U.S. PATENT DOCUMENTS

| 2009/0061362 | A1* | 3/2009 | Taoka | G03F 1/144 430/319 |
| 2011/0272815 | A1* | 11/2011 | Misaka | G06F 17/5072 257/773 |
| 2014/0115553 | A1 | 4/2014 | Lee et al. | |
| 2014/0203378 | A1 | 7/2014 | Ou et al. | |
| 2014/0218171 | A1 | 8/2014 | Luo et al. | |
| 2014/0264572 | A1* | 9/2014 | Kim | H01L 21/3083 257/331 |

FOREIGN PATENT DOCUMENTS

| CN | 104051270 | 9/2014 |
| TW | 201423462 | 6/2014 |

* cited by examiner

*Primary Examiner* — Vuthe Siek
(74) *Attorney, Agent, or Firm* — Hauptman Ham, LLP

(57) ABSTRACT

A method of forming a layout design is disclosed. The method includes placing a first set of layout patterns in a first layout layer and placing a second set of layout patterns in a second layout layer. The first set of layout patterns is aligned with one or more grid lines of a first set of grid lines. The first set of grid lines extends along a first direction, where two grid lines of the first set of grid lines overlap two cell boundaries of a standard cell layout. The second set of layout patterns is aligned with one or more grid lines of a second set of grid lines. The second set of grid lines extends along the first direction and has at least two different line pitches, where two grid lines of the second set of grid lines overlap two cell boundaries of the standard cell layout.

20 Claims, 8 Drawing Sheets

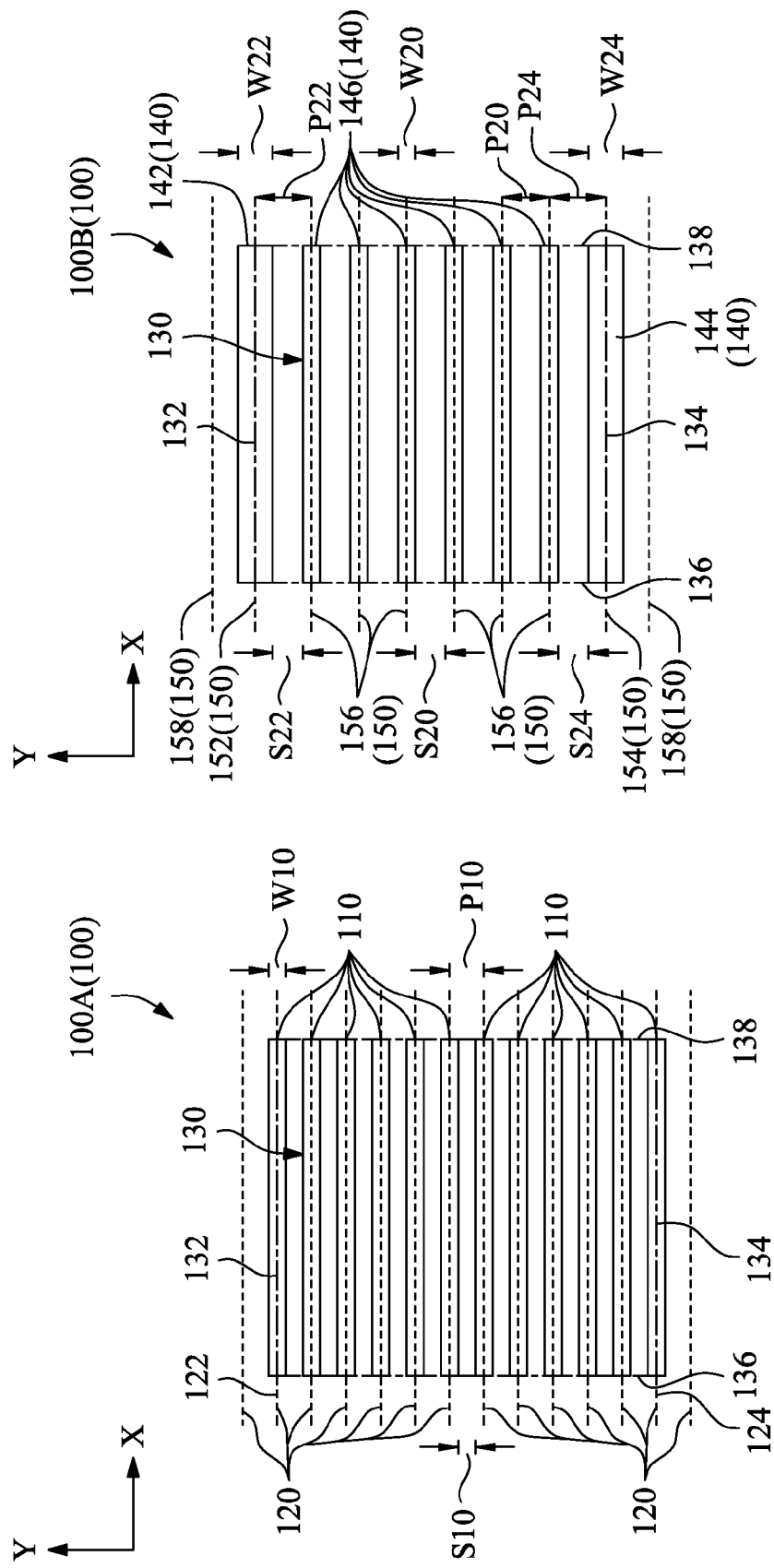

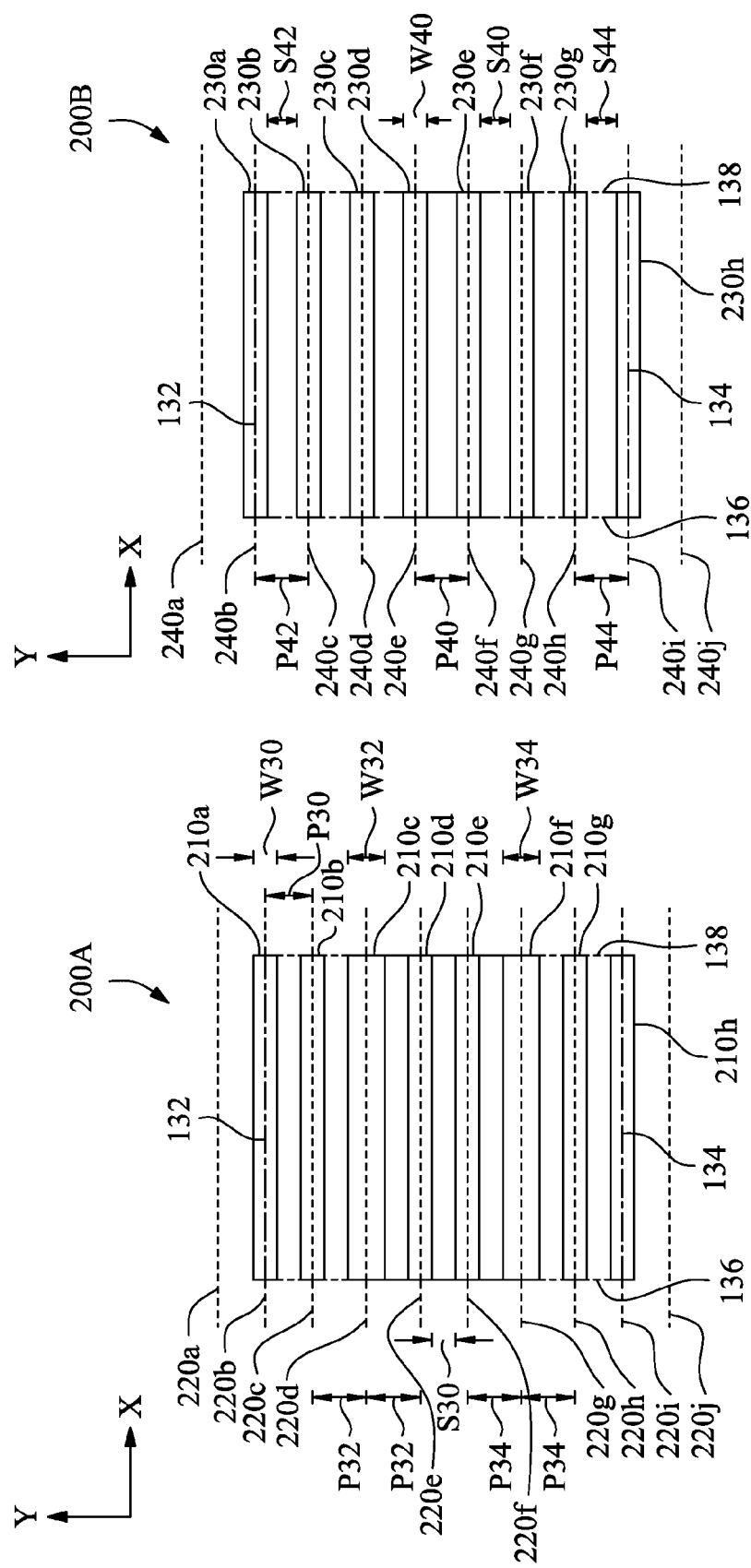

METHOD AND SYSTEM OF FORMING LAYOUT DESIGN

BACKGROUND

An integrated circuit (IC) is fabricated according to a layout design usable to form a plurality of masks for selectively forming or removing various layers of features, such as active regions, gate electrodes, various layers of isolation structures, and/or various layers of conductive structures. Many fabrication processes are available to increase the spatial resolution of various layers of features and thus allow layout patterns to have a finer spatial resolution requirement in a corresponding layout. Some approaches usable for increasing the spatial resolution include using one or more fabrication processes such as ultraviolet lithography, extreme ultraviolet lithography, electron-beam lithography, and/or multiple-patterning. In many applications, the finest available spatial resolutions of various layers are different.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a diagram of a portion of a layout design showing a first layout layer having layout patterns placed based on a first set of grid lines in accordance with some embodiments.

FIG. 1B is a diagram of a portion of the layout design of FIG. 1A showing a second layout layer having layout patterns placed based on a second set of grid lines in accordance with some embodiments.

FIGS. 2A-2C are diagrams of grid lines usable as alternatives of the second set of grid lines in FIG. 1B and corresponding example layout patterns in accordance with some embodiments.

DETAILED DESCRIPTION

Figure 2C:
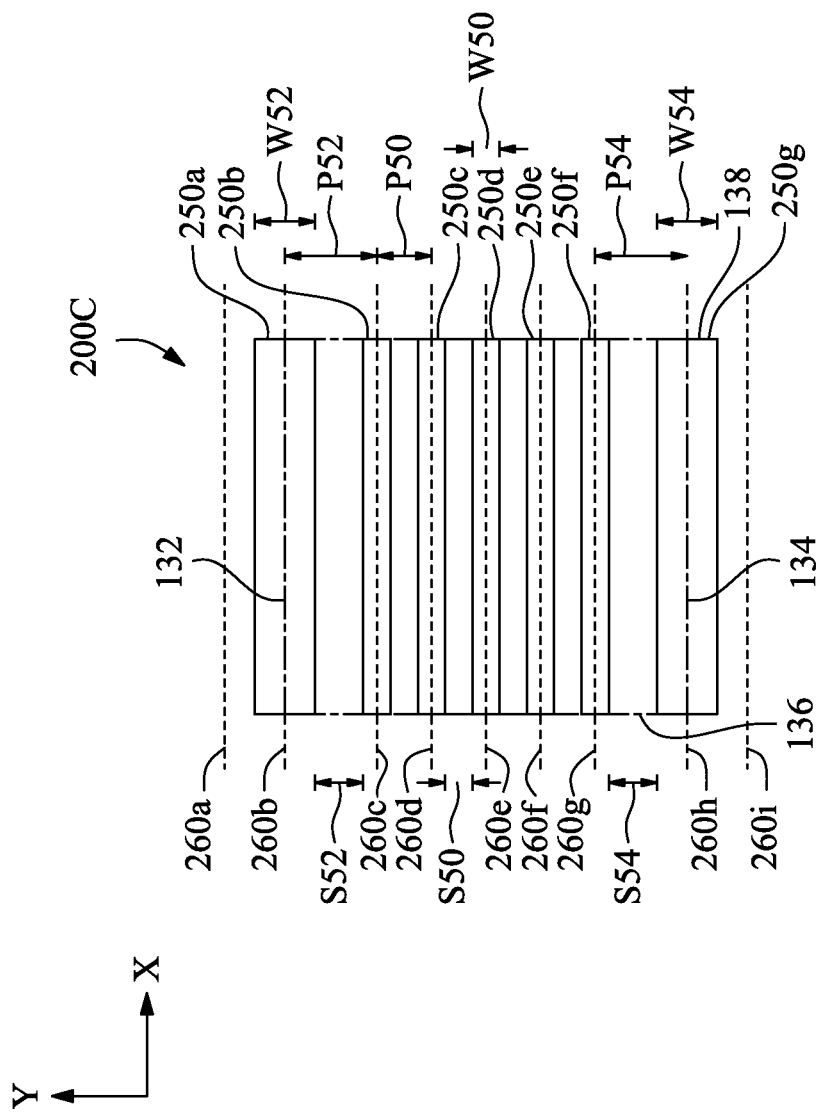

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with one or more embodiments of the present application, two layout layers each have a corresponding set of grid lines for placing layout patterns accordingly. In some embodiments, both sets of grid lines of the two layout layers include gird lines overlapping with cell boundaries of standard cell layouts. Also, at least one of the two layout layers has at least two different line pitches. Therefore, only some of the resulting components corresponding to the at least one of the two layout layers cannot be fabricated under an optimized fine pitch. Compared with a configuration that widens a line pitch of one of the two sets of grid lines of the two layout layers to accommodate the line pitch of the other set of grid lines, the embodiments according to the present application have most of the resulting components corresponding to the two layout layers still be fabricated under their corresponding optimized fine pitch.

FIG. 1A is a diagram of a portion 100A of a layout design 100 in accordance with some embodiments. FIG. 1A depicts a first layout layer having layout patterns 110 placed based on a first set of grid lines 120. Layout patterns 110 are part of a standard cell layout, which has a standard cell region 130 surrounded by cell boundaries 132 and 134 extending along a direction X and cell boundaries 136 and 138 extending along a direction Y.

First set of grid lines 120 extends along direction X and has a line pitch P10. First set of grid lines 120 has a first grid line 122 overlapping cell boundary 132 and a second grid line 124 overlapping cell boundary 134. Layout patterns 110 are placed to be aligned with corresponding grid lines of first set of grid lines 120. In this disclosure, a layout pattern is aligned with a grid line if a center line of the layout pattern overlaps the grid line. Layout patterns 110 have a width W10. A spacing S10 between two adjacent layout patterns of layout patterns 110 is determinable in a manner that S10=(P10−W10).

First set of layout patterns 110 corresponds to fabricating a first set of components of an integrated circuit in a first component layer extending along direction X. In some embodiments, line pitch P10, width W10, and spacing S10 are set to minimize an area of the resulting integrated circuit permitted by a predetermined manufacturing process. In this application and in some embodiments, such line pitch P10 is also referred to as an optimized fine pitch of the first layout layer.

In some embodiments, first set of grid lines 120 representing the reference lines available for placing a layout pattern corresponding to the first layout layer. In some embodiments, one or more layout patterns of layout patterns 110 are omitted, and one or more layout patterns of layout patterns 110 have different lengths and/or different number of segments along a corresponding grid line of first set of grid lines 120.

In the resulting integrated circuit manufactured according to layout design 100, the first set of components in the first component layer also aligned the first set of grid lines 120 and having center-to-center pitch corresponding to line pitch P10. In some embodiments, a first component of the first set of components is aligned with grid line 122 and cell boundary 132. In some embodiments, a second component of the first set of components is aligned with grid line 124 and cell boundary 134.

FIG. 1B is a diagram of a portion 100B of the layout design 100 of FIG. 1A in accordance with some embodiments. FIG. 1B depicts a second layout layer having layout patterns 140 placed based on a second set of grid lines 150. Layout patterns 140 are part of the standard cell layout of FIG. 1A having standard cell region 130 surrounded by cell boundaries 132, 134, 136, and 138.

Second set of grid lines 150 extends along direction X and has a first grid line 152 overlapping cell boundary 132 and a second grid line 154 overlapping cell boundary 134. Second set of grid lines 150 further includes grid lines 156 running through standard cell region 130 and grid lines 158 falling outside of standard cell region 130. Grid lines 156 have a line pitch P20. Grid line 152 to a closest one of grid lines 156 has a line pitch P22, and grid line 154 to a closest one of grid lines 156 has a line pitch P24. In the embodiment depicted in FIG. 1B, line pitches P22 and P24 are greater than line pitch P20. Accordingly, second set of grid lines 150 has at least two different line pitches.

Layout patterns 140 are placed to be aligned with corresponding grid lines of first set of grid lines 150. Layout patterns 140 include a layout pattern 142 aligned along grid line 152, a layout pattern 144 aligned along grid line 154, and each of layout patterns 146 is aligned along a corresponding grid line 156. Layout patterns 146 have a width W20. Layout pattern 142 has a width W22, and layout pattern 144 has a width W24. In the embodiment depicted in FIG. 1B, widths W22 and W24 are greater than width W20. Accordingly, layout patterns 140 have at least two different line widths.

In some embodiments, layout patterns 142 and 144, with their wider widths W22 and W24 compared with width W20 of layout patterns 146, have less unit-length-resistivity and are usable to fabricate power lines or signal lines that run through, e.g., five or more standard cells.

Moreover, layout patterns 146 have a spacing S20. Layout pattern 142 and a closest one of layout patterns 146 have a spacing S22, and layout pattern 144 and a closest one of layout patterns 146 have a spacing S24. Spacing S20 is determinable in a manner that S20=(P20−W20). Spacing S22 is determinable in a manner that S22=(P20−0.5·(W20+W22)). Spacing S24 is determinable in a manner that S24=(P20−0.5·(W20+W24)). In the embodiment depicted in FIG. 1B, spacing S22, S24, and S20 are the same. In some embodiments, spacing S22 and S24 are different form spacing S20.

Second set of layout patterns 140 corresponds to fabricating a second set of components of the integrated circuit discussed above in FIG. 1A in a second component layer extending along direction X. In some embodiments, line pitch P20, width W20, and space S20 are set to minimize an area of the resulting integrated circuit permitted by the predetermined manufacturing process herein. In some embodiments, second set of grid lines 150 representing the reference lines available for placing a layout pattern corresponding to the second layout layer. Therefore, in some embodiments, one or more layout patterns of layout patterns 140 are omitted, and one or more layout patterns of layout patterns 150 have different lengths and/or different number of segments along a corresponding grid line of first set of grid lines 150.

In the resulting integrated circuit manufactured according to layout design 100, the second set of components in the second component layer also aligned the second set of grid lines 150 and having center-to-center pitches corresponding to line pitch P20, P22, and P24. In some embodiments, a first component of the second set of components is aligned with grid line 152 and cell boundary 132. In some embodiments, a second component of the second set of components is aligned with grid line 154 and cell boundary 134.

In the embodiment depicted in FIGS. 1A-1B, the first component layer corresponds to a fin structure layer for FinFETs, and the second component layer corresponds to a conductive layer over the fin structure layer. In some embodiments, the first component layer corresponds to a first conductive layer over a fin structure layer, and the second component layer corresponds to a second conductive layer over the first conductive layer.

A standard cell layout is usable for fabricating a standard cell of an integrated circuit. In FIGS. 1A and 1B, some layout patterns and features of the standard cell layout are simplified and/or omitted. In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells.

FIGS. 2A-2C are diagrams of grid lines usable as alternatives of the second set of grid lines 150 in FIG. 1B and corresponding example layout patterns in accordance with some embodiments. Components in FIGS. 2A-2C that are the same or similar to those in FIG. 1B are given the same reference numbers.

FIG. 2A depicts a portion 200A of a layout including a layout layer usable to replace the second layout layer of FIG. 1B. The layout layer in FIG. 2A includes layout patterns 210a-210h placed based on a set of grid lines 220, including grid lines 220a-220j.

The set of grid lines 220 extends along direction X. Grid line 220b overlaps cell boundary 132, and grid line 220i overlaps cell boundary 134. Grid lines 220a-220c, 220e and 220f, and 220h-220j have a line pitch P30. Grid line 220d to neighboring grid lines thereof 220c and 220e has a line pitch P32. Grid line 220g to neighboring grid lines thereof 220f and 220h has a line pitch P34. In the embodiment depicted in FIG. 2A, line pitches P32 and P34 are greater than line pitch P30. In some embodiments, line pitches P32 and P34 are the same.

Layout patterns 210a-210h are placed to be aligned with corresponding grid lines 220b-220i. Layout pattern 210a is aligned along grid line 220b and cell boundary 132, and layout pattern 210h is aligned along grid line 220i and cell boundary 134. Layout patterns 210a, 21b, 210d, 210e, 210g, and 210h have a width W30. Layout pattern 210c has a width W32, and layout pattern 210f has a width W34. In the embodiment depicted in FIG. 2A, widths W32 and W34 are greater than width W30. In some embodiments, widths W32 and W34 are the same.

In some embodiments, layout patterns 210c and 210f, with their wider widths W32 and W34 compared with width W30, have less unit-length-resistivity and are usable to fabricate power lines or signal lines that run through five or more standard cells.

Moreover, layout patterns 210a-210h have a spacing S30. Spacing S30 is determinable in a manner that $S30=(P30-W30)=(P32-0.5\cdot(W30+W32))=(P34-0.5\cdot(W30+W34))$. Layout patterns 210a-210h correspond to fabricating a set of components of the integrated circuit. In some embodiments, line pitch P30, width W30, and space S30 are set to minimize an area of the resulting integrated circuit permitted by the predetermined manufacturing process advanced above.

In some embodiments, grid lines 220a-220j represent the reference lines available for placing a layout pattern of the corresponding layout layer. Therefore, in some embodiments, one or more layout patterns of layout patterns 210a-210h are omitted, and one or more layout patterns of layout patterns 210a-210h have different lengths and/or different number of segments along a corresponding grid line of grid lines 220a-220j.

FIG. 2B depicts a portion 200B of a layout including a layout layer usable to replace the second layout layer of FIG. 1B. The layout layer in FIG. 2B includes layout patterns 230a-230h placed based on a set of grid lines 240, including grid lines 240a-240j. Layout patterns 230a-230h correspond to layout patterns 210a-210h in FIG. 2A, and grid lines 240a-240j correspond to grid lines 220a-220j in FIG. 2A. Detailed description thereof is thus omitted.

Compared with the embodiments depicted in FIG. 1B and FIG. 2A, FIG. 2B is usable to illustrate that, in some embodiments, the number of different line pitches of grid lines 240a-240i are greater than or equal to two, while the widths of layout patterns 230a-230h keep the same.

In FIG. 2B, layout patterns 230a-230h have a width W40 corresponding to line width W30. Grid lines 240c-240h have a line pitch P40 corresponding to line pitch P30. Grid lines 240b and 240c have a line pitch P42, and grid lines 240h and 240i have a line pitch P44. Grid line 240b overlaps cell boundary 132, and grid line 240i overlaps cell boundary 134. In the embodiment depicted in FIG. 2B, the line pitch P44 is greater than line pitch P40, and line pitch P42 is greater than line pitch P40.

Moreover, layout patterns 230b-230g have a spacing S40. Spacing S40 is determinable in a manner that $S40=(P40-W40)$. Layout patterns 230a and 230b have a spacing S42. Spacing S42 is determinable in a manner that $S42=(P42-W40)$. Layout patterns 230g and 230h have a spacing S44. Spacing S44 is determinable in a manner that $S44=(P44-W40)$. In some embodiments, line pitch P40, width W40, and space S40 are set to minimize an area of the resulting integrated circuit permitted by the predetermined manufacturing process advanced above.

In some embodiments, grid lines 240a-240j represent the reference lines available for placing a layout pattern of the corresponding layout layer. Therefore, in some embodiments, one or more layout patterns of layout patterns 230a-230h are omitted, and one or more layout patterns of layout patterns 230a-230h have different lengths and/or different number of segments along a corresponding grid line of grid lines 240a-240j.

FIG. 2C depicts a portion 200C of a layout including a layout layer usable to replace the second layout layer of FIG. 1B. The layout layer in FIG. 2C includes layout patterns 250a-250g placed based on a set of grid lines 260, including grid lines 260a-260i. Layout patterns 250a-250g correspond to layout patterns 210a-210h in FIG. 2A, and grid lines 260a-260i correspond to grid lines 220a-220j in FIG. 2A. Detailed description thereof is thus omitted.

Compared with the embodiments depicted in FIG. 1B and FIG. 2A, FIG. 2C is usable to illustrate that, in some embodiments, the number of different widths of layout patterns 250a-250g is greater than or equal to two, and the number of different line pitches is also set to be greater than or equal to two.

In FIG. 2C, grid lines 260c-260g have a line pitch P50 corresponding to line pitch P30. Grid lines 260b and 260c have a line pitch P52, and grid lines 260g and 260h have a line pitch P54. Grid line 260b overlaps cell boundary 132, and grid line 260h overlaps cell boundary 134. In the embodiment depicted in FIG. 2C, line pitches P54 and P52 are the same and are greater than line pitch P50. In some embodiments, line pitches P52 and P54 are different.

Layout patterns 250b-250f have a width W50 corresponding to width W30. Layout pattern 250a has a line width W52, and layout pattern 250g has a width W54. In the embodiment depicted in FIG. 2C, width W54 is greater than width W52, and width W52 is greater than width W50.

Moreover, layout patterns 250b-250f have a spacing S50. Spacing S50 is determinable in a manner that $S50=(P50-W50)$. Layout patterns 250a and 250b have a spacing S52. Spacing S52 is determinable in a manner that $S52=(P52-0.5\cdot(W52+W50))$. Layout patterns 250f and 250g have a spacing S54. Spacing S54 is determinable in a manner that $S54=(P54-0.5\cdot(W54+W50))$. In some embodiments, line pitch P50, width W50, and space S50 are set to minimize an area of the resulting integrated circuit permitted by the predetermined manufacturing process advanced above.

In some embodiments, grid lines 260a-260i represent the reference lines available for placing a layout pattern of the corresponding layout layer. Therefore, in some embodiments, one or more layout patterns of layout patterns 250a-250g are omitted, and one or more layout patterns of layout patterns 250a-250g have different lengths and/or different number of segments along a corresponding grid line of grid lines 260a-260i.

In some embodiments, a set of grid lines and corresponding layout patterns usable for the second layout layer has a combination of characteristics of one or more of the embodiments depicted in FIGS. 1B and 2A-2C.

Figure 3:
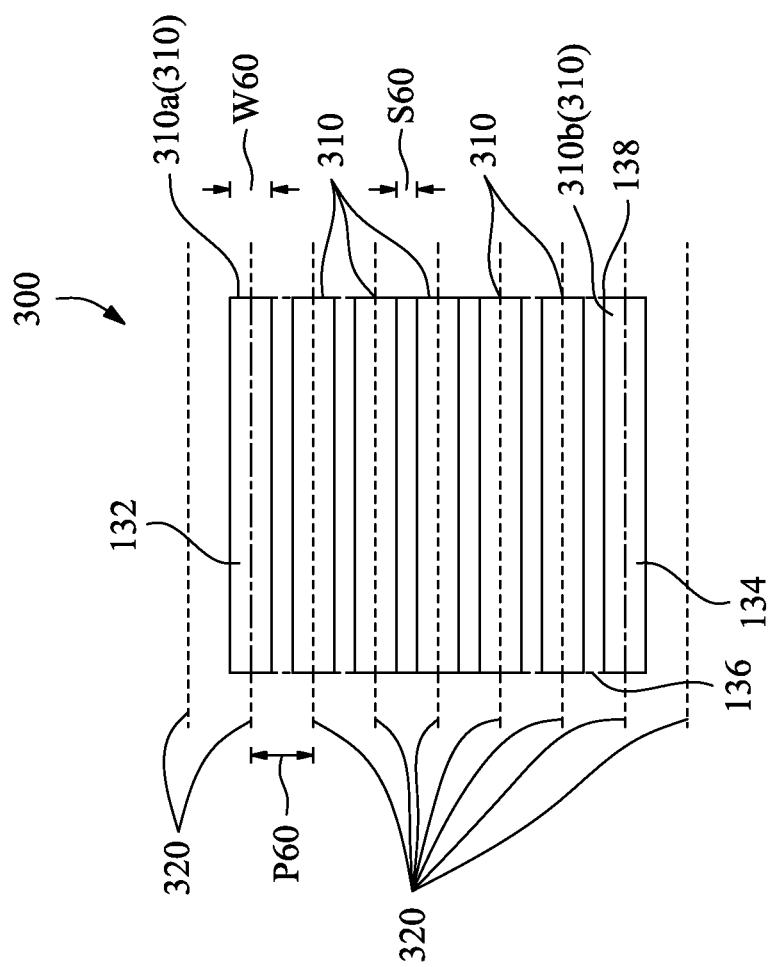
FIG. 3 is a diagram of grid lines usable as an alternative of the first set of grid lines in FIG. 1A and corresponding example layout patterns in accordance with some embodiments.

FIG. 3 is a diagram of grid lines usable as an alternative of the first set of grid lines in FIG. 1A and corresponding example layout patterns in accordance with some embodiments. FIG. 3 depicts a portion 300 of a layout including a layout layer usable to replace the first layout layer of FIG. 1A. The layout layer in FIG. 3 includes layout patterns 310 placed based on a set of grid lines 320. FIG. 3 also depicts a standard cell region 130 surrounded by cell boundaries 132, 134, 136, and 138. Layout patterns 310 correspond to layout patterns 110 in FIG. 1A, and grid lines 320 correspond to grid lines 120 in FIG. 1A. Detailed description thereof is thus omitted.

Grid lines 320 have a line pitch P60. Layout patterns 310 are aligned with corresponding grid lines 320. Layout pattern 310a is aligned with cell boundary 132, and layout pattern 310b is aligned with cell boundary 134. Layout patterns 310 have a width W60 and a spacing S60. Spacing S60 is determinable in a manner that $S60=(P60-W60)$. In some embodiments, line pitch P60, width W60, and space S60 are set to minimize an area of the resulting integrated circuit permitted by the predetermined manufacturing process described herein.

The embodiment depicted in FIG. 3 has a line pitch P60 greater than line pitches P20, P30, P40, or P50 for the second layout layer depicted in FIGS. 1B and 2A-2C. In contrast, the embodiment in FIG. 1A has a line pitch P10 less than line pitches P20, P30, P40, or P50. In some embodiments, the first component layer depicted in FIG. 3 corresponds to a first conductive layer, and the second component layer according to FIGS. 1B and 2A-2C corresponds to a second conductive layer over or below first conductive layer.

In some embodiments, grid lines 320 represent the reference lines available for placing a layout pattern of the corresponding layout layer. Therefore, in some embodiments, one or more layout patterns of layout patterns 310 are omitted, and one or more layout patterns of layout patterns 310 have different lengths and/or different number of segments along a corresponding grid line of grid lines 320.

Figure 4:
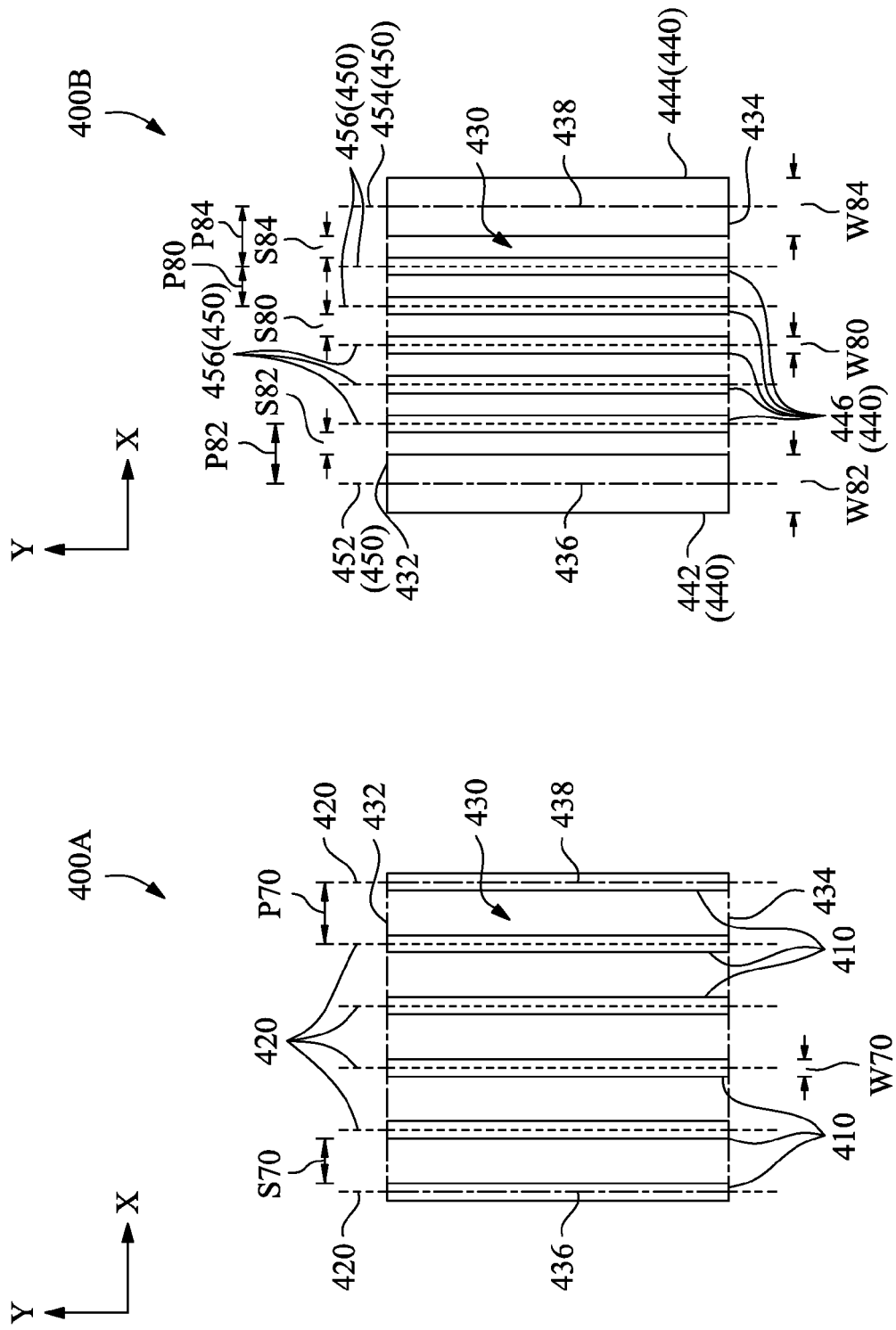
FIG. 4A is a diagram of a portion of another layout design showing a first layout layer having layout patterns placed based on a first set of grid lines in accordance with some embodiments.
FIG. 4B is a diagram of a portion of the another layout design of FIG. 4A showing a second layout layer having layout patterns placed based on a second set of grid lines in accordance with some embodiments.

FIG. 4A is a diagram of a portion 400A of another layout design 400 in accordance with some embodiments. FIG. 4A depicts a first layout layer of layout design 400 having layout patterns 410 placed based on a third set of grid lines 420. Layout patterns 410 are part of a standard cell layout, which has a standard cell region 430 surrounded by cell boundaries 432 and 434 extending along a direction X and cell boundaries 436 and 438 extending along a direction Y. Standard cell region 430 and cell boundaries 432-438 correspond to standard cell region 130 and cell boundaries 132-138, and detailed description thereof is thus omitted.

Compared with grid lines 120 in FIG. 1A, third set of grid lines 420 extends along direction Y and has a line pitch P70. Third set of grid lines 420 has corresponding grid lines overlapping cell boundaries 436 and 438. Layout patterns 410 are placed to be aligned with corresponding grid lines of third set of grid lines 420. Layout patterns 410 have a width W70. A spacing S70 between two adjacent grid lines of third set of grid lines 420 is determinable in a manner that S70=(P70−W70).

Third set of layout patterns 410 corresponds to fabricating a first set of components of an integrated circuit in a first component layer extending along direction Y. In some embodiments, line pitch P70, width W70, and spacing S70 are set to minimize an area of the resulting integrated circuit permitted by a predetermined manufacturing process.

FIG. 4B is a diagram of a portion 400B of the layout design 400 of FIG. 4A showing a second layout layer of layout design 400 having layout patterns 440 placed based on a fourth set of grid lines 450 in accordance with some embodiments. Layout patterns 440 are part of the standard cell layout of FIG. 4A having standard cell region 430 surrounded by cell boundaries 432-438.

Fourth set of grid lines 450 extends along direction Y and has a first grid line 452 overlapping cell boundary 436 and a second grid line 454 overlapping cell boundary 438. Fourth set of grid lines 450 further includes grid lines 456 running between cell boundaries 436 and 438. Grid lines 456 have a line pitch P80. Grid line 452 to a closest one of grid lines 456 has a line pitch P82, and grid line 454 to a closest one of grid lines 456 has a line pitch P84. In the embodiment depicted in FIG. 4B, line pitches P82 and P84 are greater than line pitch P80. In some embodiments, line pitches P82 and P84 are different.

Layout patterns 440 are placed to be aligned with corresponding grid lines of fourth set of grid lines 450. Layout patterns 440 include a layout pattern 442 aligned along grid line 452, a layout pattern 444 aligned along grid line 454, and each of layout patterns 446 is aligned along a corresponding grid line 456. Layout patterns 446 have a width W80. Layout pattern 442 has a width W82, and layout pattern 444 has a width W84. Moreover, layout patterns 446 have a spacing S80. Layout pattern 442 and a closest one of layout patterns 446 have a spacing S82, and layout pattern 444 and a closest one of layout patterns 446 have a spacing S84. In the embodiment depicted in FIG. 4B, widths W82 and W84 are greater than width W20. In some embodiments, line widths W82 and W84 are different.

Layout patterns 440 corresponds to fabricating a second set of components of the integrated circuit discussed above in FIG. 4A in a second component layer extending along direction Y. In some embodiments, line pitch P80, width W80, and space S80 are set to minimize an area of the resulting integrated circuit permitted by the predetermined manufacturing process advanced above.

In the embodiment depicted in FIGS. 4A-4B, the first component layer corresponds to a gate structure layer, and the second component layer corresponds to a conductive layer over the gate structure layer. In some embodiments, the first component layer corresponds to a first conductive layer over a gate structure layer, and the second component layer corresponds to a second conductive layer over the first conductive layer.

In view of the above, the embodiments depicted in FIGS. 4A and 4B are arranged in a manner similar to the embodiments depicted in FIGS. 1A and 1B, except the orientations of the grid lines and layout patterns. In some embodiments, the embodiments depicted in FIGS. 2A-2C are also usable to be modified to work as alternatives of the embodiment of FIG. 4B. In some embodiments, the embodiment depicted in FIG. 3 is also usable to be modified to work as an alternative of the embodiment of FIG. 4A.

Figure 5:
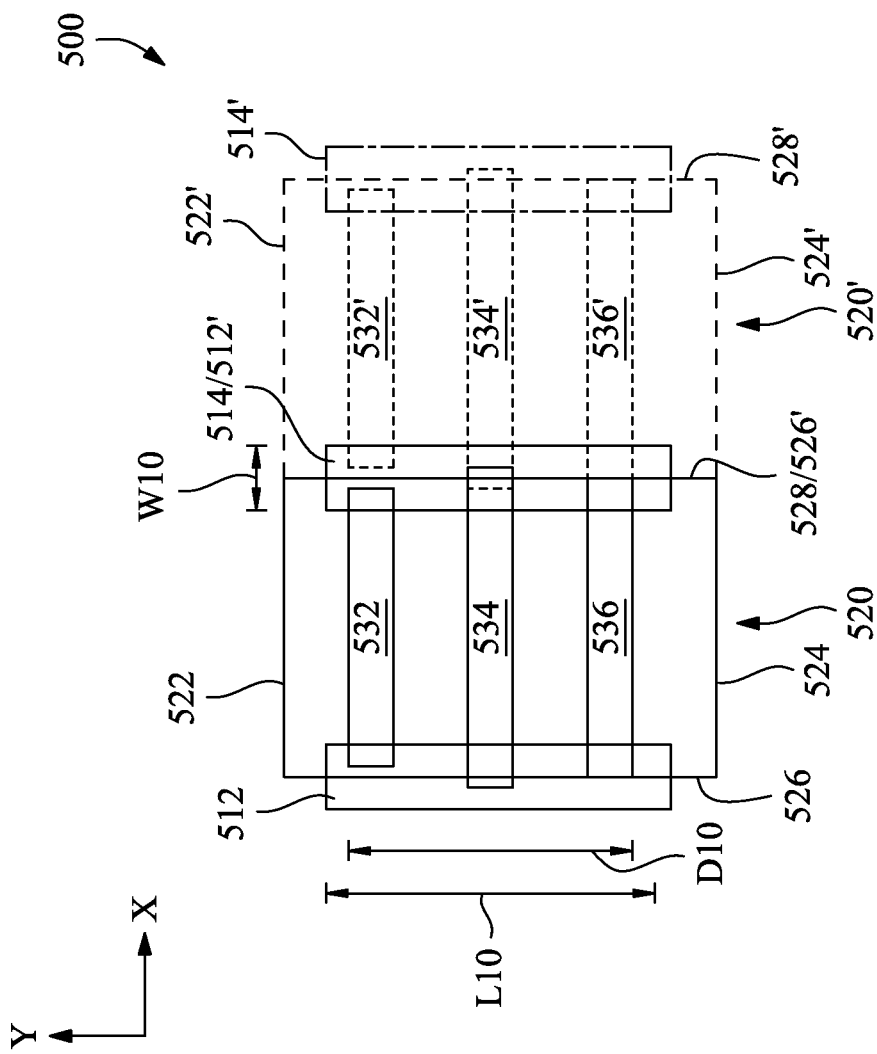
FIG. 5 is a diagram of a portion of a layout design having a set of cutting layout patterns in accordance with some embodiments.

FIG. 5 is a diagram of a portion of a layout design 500 having a set of cutting layout patterns 512 and 514 in accordance with some embodiments.

Layout design 500 includes a standard cell 520 that is configured to be abutted with another standard cell 520'. Standard cell 520 includes cell boundaries 522 and 524 extending along direction X and cell boundaries 526 and 528 extending along direction Y. Standard cell 520 includes a set of layout patterns 532, 534, and 536 extending along direction X and collectively spanning for a distance D10 measurable along direction Y. In the embodiment depicted in FIG. 5, layout pattern 532 is between cell boundaries 526 and 528, layout pattern 534 extends beyond cell boundaries 526 and 528, and layout pattern 536 having edges overlapping cell boundaries 526 and 528. Layout pattern 532, 534, and 536 correspond to a set of components in a component layer extending along direction X. In some embodiments, the component layer formed based on layout pattern 532, 534, and 536 is a conductive layer.

Cutting layout patterns 512 and 514 correspond to a portion of the set of components that is formed based on layout pattern 532, 534, and 536 and subject to be removed by a removal process. Cutting layout pattern 512 is aligned with cell boundary 526, and cutting layout pattern 514 is aligned with cell boundary 528. Cutting layout patterns 512 and 514 has a length L10 equal to or greater than distance D10. Cutting layout patterns 512 and 514 has a width W10. W10 is set to ensure a sufficient clearance, such as 0.4·W10 to 0.6·W10, of any resulting components in the corresponding conductive layer to nearest cell boundaries 526 or 528. In some embodiments, width W10 is set according to a minimum spacing between components in the corresponding component layer allowable by a predetermined fabrication process.

Standard cell 520' has a configuration similar to that of standard cell 520, including cell boundaries 522', 524', 526', and 528', layout patterns 532', 534', and 536', and cutting layout patterns 512' and 514'. With the cutting layout patterns 512, 514, 512', and 514', standard cells 520 and standard cell 520' are suitable to be seamlessly abutted at cell boundaries 528 and 526' without causing a violation of a design rule as a result of the lack of clearance between layout patterns 532, 534, 536, 532', 534', and 536' and corresponding cell boundaries 526, 528, 526' and 528'.

Figure 6:
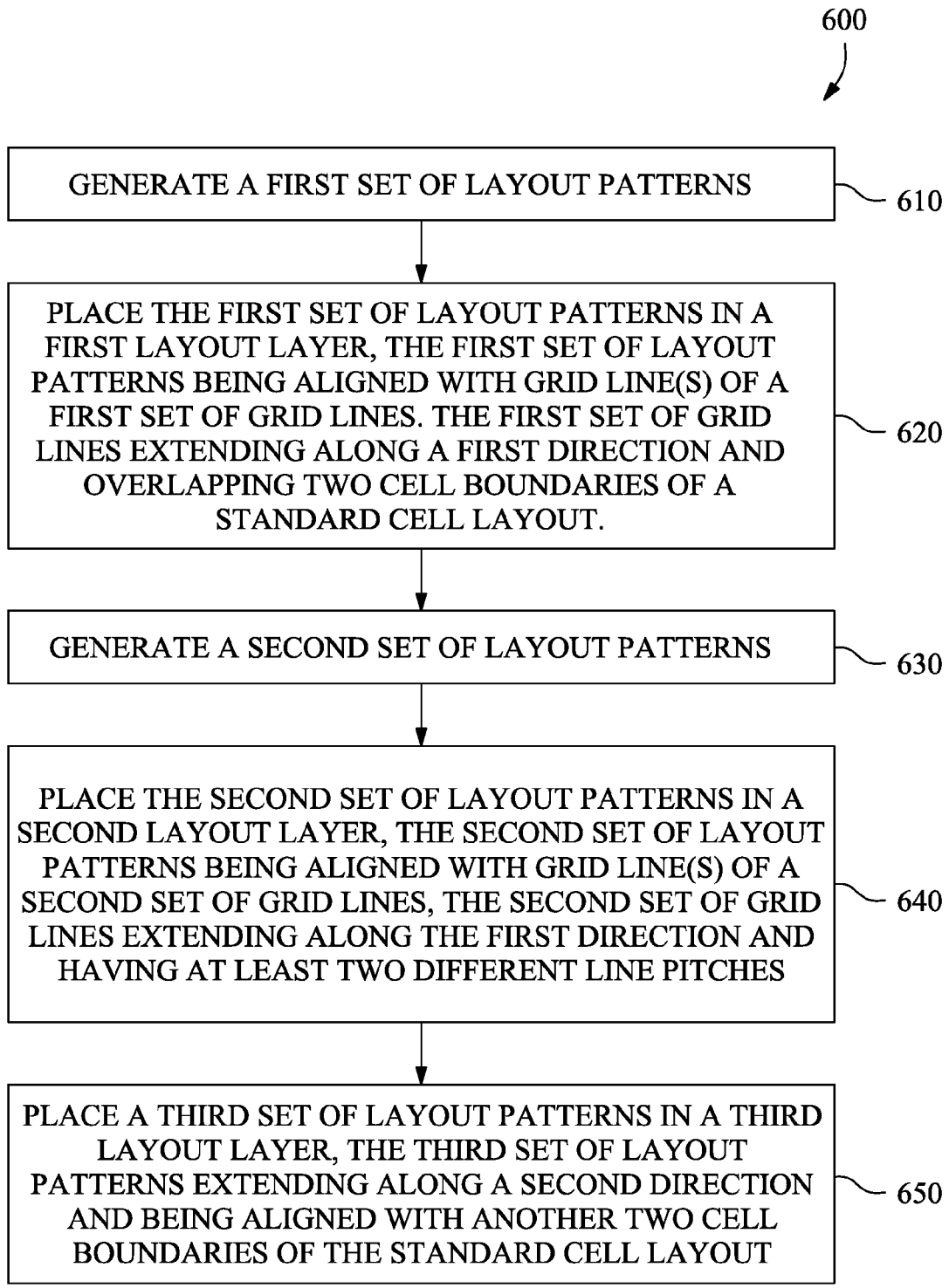
FIG. 6 is a flow chart of a method of forming a layout design in accordance with some embodiments.

FIG. 6 is a flow chart of a method 600 of forming a layout design in accordance with some embodiments. It is understood that additional operations may be performed before, during, and/or after the method 600 depicted in FIG. 6, and that some other processes may only be briefly described herein.

The method 600 begins with operation 610, where a first set of layout patterns is generated. The first set of layout patterns corresponds to fabricating a first set of components in a first component layer of an integrated circuit. In some embodiments, the first set of layout patterns correspond to layout patterns 110 in FIG. 1A, 310 in FIG. 3, or 410 in FIG. 4A.

The method 600 proceeds to operation 620, where the first set of layout patterns generated in operation 610 are placed in a first layout layer. The first set of layout patterns is aligned with one or more grid lines of a first set of grid lines. In some embodiments, the first set of grid lines corresponds to grid lines 120 in FIG. 1A, 320 in FIG. 3, or 420 in FIG. 4A. In some embodiments, a first grid line of the first set of grid lines overlaps a first cell boundary of a standard cell layout, and a second grid line of the first set of grid lines overlaps a second cell boundary of the standard cell layout.

In some embodiments, the first set of grid lines has a line pitch, such as line pitch P10 in FIG. 1A, P60 in FIG. 3, and P70 in FIG. 4A. In some embodiments, the first set of layout patterns has a width, such as width W10 in FIG. 1A, W60 in FIG. 3, and W70 in FIG. 4A.

The method 600 proceeds to operation 630, where a second set of layout patterns is generated. The second set of layout patterns corresponds to fabricating a second set of components in a second component layer of the integrated circuit. In some embodiments, the second set of layout patterns correspond to layout patterns 140 in FIG. 1B, 210a-210h in FIG. 2A, 230a-230h in FIG. 2B, 250a-250g in FIG. 2C, or 440 in FIG. 4B.

The method 600 proceeds to operation 640, where the second set of layout patterns generated in operation 630 are placed in a second layout layer. The second set of layout patterns is aligned with one or more grid lines of a second set of grid lines. In some embodiments, the second set of grid lines corresponds to grid lines 150 in FIG. 1B, 220a-220j in FIG. 2A, 240a-240j in FIG. 2B, 260a-260i in FIG. 2C, or 450 in FIG. 4B. In some embodiments, a first grid line of the second set of grid lines overlaps the first cell boundary of the standard cell layout, and a second grid line of the second set of grid lines overlaps the second cell boundary of the standard cell layout.

In some embodiments, the second set of grid lines has at least two different line pitches, such as line pitches P20, P22, and P24 in FIG. 1B, P30, P32, and P34 in FIG. 2A, P40, P42, and P44 in FIG. 2B, P50, P52, and P54 in FIG. 2C, or P80, P82, and P84 in FIG. 4B. The second set of layout patterns has a width, such as width W40 in FIG. 2B. In some embodiments, the second set of layout patterns has at least two different widths, such as widths W20, W22, and W24 in FIG. 1B, W30, W32, and W34 in FIG. 2A, W50, W52, and W54 in FIG. 2C, or W80, W82, and W84 in FIG. 4B.

The method 600 proceeds to operation 650, where a third set of layout patterns is generated and placed in a third layout layer. In some embodiments, the third set of layout patterns corresponding to a portion of the second set of components that is subject to be removed by a removal process. In some embodiments, the third set of layout patterns correspond to layout patterns 512, 514, 512' and 514' in FIG. 5.

In some embodiments, the first component layer and the second component layer each correspond to a different one of the following component layers of the integrated circuit: a fin structure layer for FinFETs; a first conductive layer over the fin structure layer; and a second conductive layer over the first conductive layer. In some embodiments, the first component layer and the second component layer each correspond to a different one of the following component layers of the integrated circuit: a gate structure layer; a first conductive layer over the gate structure layer; and a second conductive layer over the first conductive layer.

Figure 7:
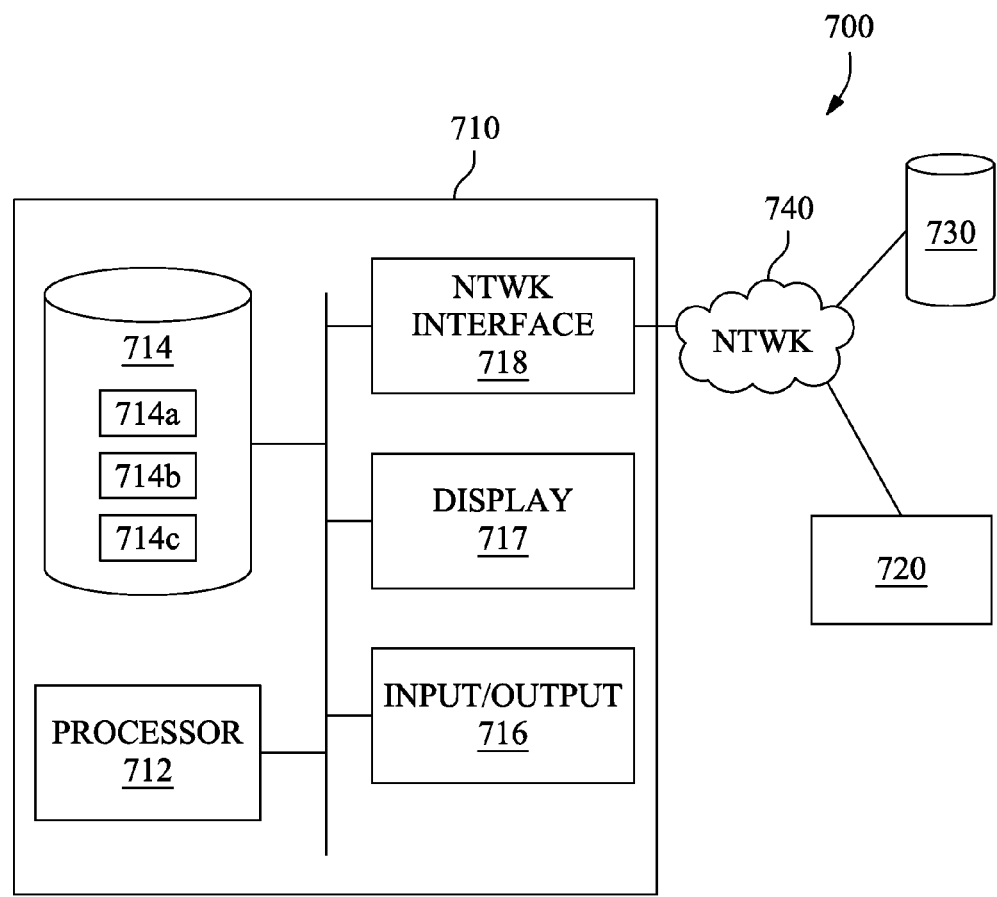
FIG. 7 is a block diagram of a layout designing system in accordance with some embodiments.

FIG. 7 is a functional block diagram of a layout designing system 700 in accordance with some embodiments. Layout designing system 700 is usable for implementing one or more operations of the method 600 disclosed in FIG. 6 and further explained in conjunction with FIGS. 1A-5.

Layout designing system 700 includes a first computer system 710, a second computer system 720, a networked storage device 730, and a network 740 connecting the first computer system 710, the second computer system 720, and the networked storage device 730. In some embodiments, one or more of the second computer system 720, the storage device 730, and the network 740 are omitted.

The first computer system 710 includes a hardware processor 712 communicatively coupled with a non-transitory, computer readable storage medium 714 encoded with, i.e., storing, a set of instructions 714a, a layout design 714b, or any intermediate data 714c for executing the set of instructions 714a. The processing unit 712 is electrically and communicatively coupled with the computer readable storage medium 714. The processor 712 is configured to execute the set of instructions 714a encoded in the computer readable storage medium 714 in order to cause the computer 710 to be usable as a layout designing tool for performing a method 600 as described in conjunction with FIG. 6.

In some embodiments, the set of instructions 714a, the layout design 714b, or the intermediate data 714c are stored in a non-transitory storage medium other than storage medium 714. In some embodiments, some or all of the set of instructions 714a, the layout design 714b, or the intermediate data 714c are stored in a non-transitory storage medium in networked storage device 730 or second computer system 720. In such case, some or all of the set of instructions 714a, the layout design 714b, or the intermediate data 714c stored outside computer 710 is accessible by the processing unit 712 through the network 740.

In some embodiments, the processor 712 is a central processing unit (CPU), a multi-processor, a distributed processing system, an application specific integrated circuit (ASIC), and/or a suitable processing unit.

In some embodiments, the computer readable storage medium 714 is an electronic, magnetic, optical, electromagnetic, infrared, and/or a semiconductor system (or apparatus or device). For example, the computer readable storage medium 714 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 714 includes a compact disk-read only memory (CD-ROM), a compact disk-read/write (CD-R/W), and/or a digital video disc (DVD).

The computer system 710 includes, in at least some embodiments, an input/output interface 716 and a display unit 717. The input/output interface 716 is coupled to the processor 712 and allows the circuit designer to manipulate the first computer system 710. In at least some embodiments, the display unit 717 displays the status of executing the set of instructions 714a and, in at least some embodiments, provides a Graphical User Interface (GUI). In at least some embodiments, the display unit 717 displays the status of executing the set of instructions 714a in a real time manner. In at least some embodiments, the input/output interface 716 and the display 717 allow an operator to operate the computer system 710 in an interactive manner.

In at least some embodiments, the computer system 700 also includes a network interface 718 coupled to the processor 712. The network interface 718 allows the computer system 710 to communicate with the network 740, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with one embodiment, a method of forming a layout design for fabricating an integrated circuit is disclosed. The method includes placing a first set of layout patterns in a first layout layer and placing a second set of layout patterns in a second layout layer. At least one of the above operations is performed by a hardware processor. The first set of layout patterns is aligned with one or more grid lines of a first set of grid lines. The first set of layout patterns corresponds to fabricating a first set of components in a first component layer of the integrated circuit. The first set of grid lines extends along a first direction, where a first grid line of the first set of grid lines overlaps a first cell boundary of a standard cell layout, and a second grid line of the first set of grid lines overlaps a second cell boundary of the standard cell layout. The second set of layout patterns is aligned with one or more of a second set of grid lines. The second set of layout patterns corresponds to fabricating a second set of components in a second component layer of the integrated circuit. The second set of grid lines extends along the first direction and has at least two different line pitches, where a first grid line of the second set of grid lines overlaps the first cell boundary of the standard cell layout, and a second grid line of the second set of grid lines overlaps the second cell boundary of the standard cell layout.

In accordance with another embodiment, a layout designing system includes a non-transitory storage medium encoded with a set of instructions; and a hardware processor communicatively coupled with the non-transitory storage medium and configured to execute the set of instruction. The set of instruction is configured to cause the processor to place a first set of layout patterns in a first layout layer and to place a second set of layout patterns in a second layout layer. The first set of layout patterns is aligned with one or more grid lines of a first set of grid lines. The first set of layout patterns corresponds to fabricating a first set of components in a first component layer of the integrated circuit. The first set of grid lines extends along a first direction, where a first grid line of the first set of grid lines overlaps a first cell boundary of a standard cell layout, and a second grid line of the first set of grid lines overlaps a second cell boundary of the standard cell layout. The second set of layout patterns is aligned with one or more of a second set of grid lines. The second set of layout patterns corresponds to fabricating a second set of components in a second component layer of the integrated circuit. The second set of grid lines extends along the first direction and has at least two different line pitches, where a first grid line of the second set of grid lines overlaps the first cell boundary of the standard cell layout, and a second grid line of the second set of grid lines overlaps the second cell boundary of the standard cell layout.

In accordance with another embodiment, an integrated circuit includes a first set of components in a first component layer extending along a predetermined direction and a second set of components in a second component layer extending along the predetermined direction. A first component of the first set of components is aligned with a first cell boundary of a standard cell, and a second component of the first set of components is aligned with a second cell boundary of the standard cell. The second set of components in the second component layer has at least two different center-to-center pitches. A first component of the second set of components is aligned with the first cell boundary of the standard cell, and a second component of the second set of components is aligned with the second cell boundary of the standard cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a layout design for fabricating an integrated circuit, the method comprising:

placing a first set of layout patterns in a first layout layer, the first set of layout patterns being aligned with one or more grid lines of a first set of grid lines, the first set of layout patterns corresponding to fabricating a first set of components in a first component layer of the integrated circuit, the first set of grid lines extending along a first direction, a first grid line of the first set of grid lines overlapping a first cell boundary of a standard cell layout, and a second grid line of the first set of grid lines overlapping a second cell boundary of the standard cell layout; and placing a second set of layout patterns in a second layout layer, the second set of layout patterns being aligned with one or more grid lines of a second set of grid lines, the second set of layout patterns corresponding to fabricating a second set of components in a second component layer of the integrated circuit, the second set of grid lines extending along the first direction and having at least two different line pitches, a first grid line of the second set of grid lines overlapping the first cell boundary of the standard cell layout, and a second grid line of the second set of grid lines overlapping the second cell boundary of the standard cell layout, and at least one of the above operations being performed by a hardware processor.

2. The method of claim 1, further comprising:
generating the first set of layout patterns, each layout pattern of the first set of layout patterns having a first width.

3. The method of claim 2, further comprising:
generating the second set of layout patterns, each layout pattern of the second set of layout patterns having a second width.

4. The method of claim 1, further comprising:
generating the second set of layout patterns, the second set of layout patterns comprising:
a first layout pattern having a first width; and
a second layout pattern having a second width different from the first width, the first layout pattern and the second layout pattern of the second set of layout patterns being aligned with different grid lines of the second set of grid lines.

5. The method of claim 1, further comprising:
generating the second set of layout patterns, the second set of layout patterns comprising:
a first layout pattern having a first width;
a second layout pattern having a second width; and
a third layout pattern having a third width,
wherein
the first layout pattern, the second layout pattern, and the third layout pattern of the second set of layout patterns are aligned with different grid lines of the second set of grid lines; and
the first width, the second width, and the third width are different.

6. The method of claim 1, further comprising:
generating the second set of layout patterns, the second set of layout patterns comprising:
a first layout pattern aligned with the first grid line of the second set of grid lines and having a first width; and
a second layout pattern aligned with the second grid line of the second set of grid lines and having a second width different from the first width.

7. The method of claim 1, wherein the first component layer and the second component layer are independently chosen from the following component layers of the integrated circuit:
a fin structure layer for FinFETs;
a first conductive layer over the fin structure layer; and
a second conductive layer over the first conductive layer.

8. The method of claim 1, wherein the first component layer and the second component layer are independently chosen from the following component layers of the integrated circuit:
a gate structure layer;
a first conductive layer over the gate structure layer; and
a second conductive layer over the first conductive layer.

9. The method of claim 1, further comprising:
placing a third set of layout patterns in a third layout layer, the third set of layout patterns extending along a second direction and being aligned with a third cell boundary and a fourth cell boundary of the standard cell layout, the third set of layout patterns corresponding to a portion of the second set of components that is configured to be removed by a removal process.

10. A system of forming a layout design, comprising:
a non-transitory storage medium encoded with a set of instructions;

a hardware processor communicatively coupled with the non-transitory storage medium and configured to execute the set of instruction, the set of instruction being configured to cause the processor to:
place a first set of layout patterns in a first layout layer, the first set of layout patterns being aligned with one or more grid lines of a first set of grid lines, the first set of layout patterns corresponding to fabricating a first set of components in a first component layer of an integrated circuit, the first set of grid lines extending along a first direction, a first grid line of the first set of grid lines overlapping a first cell boundary of a standard cell layout, and a second grid line of the first set of grid lines overlapping a second cell boundary of the standard cell layout; and
place a second set of layout patterns in a second layout layer, the second set of layout patterns being aligned with one or more grid lines of a second set of grid lines, the second set of layout patterns corresponding to fabricating a second set of components in a second component layer of the integrated circuit, the second set of grid lines extending along the first direction and having at least two different line pitches, a first grid line of the second set of grid lines overlapping the first cell boundary of the standard cell layout, and a second grid line of the second set of grid lines overlapping the second cell boundary of the standard cell layout.

11. The layout designing system of claim 10, wherein the set of instruction is configured to cause the processor to:
generate the first set of layout patterns, each layout pattern of the first set of layout patterns having a first width.

12. The layout designing system of claim 11, wherein the set of instruction is configured to cause the processor to:
generate the second set of layout patterns, each layout pattern of the second set of layout patterns having a second width.

13. The layout designing system of claim 10, wherein the set of instruction is configured to cause the processor to:
generate the second set of layout patterns, the second set of layout patterns comprising:
a first layout pattern having a first width; and
a second layout pattern having a second width different from the first width, the first layout pattern and the second layout pattern of the second set of layout patterns being aligned with different grid lines of the second set of grid lines.

14. The layout designing system of claim 10, wherein the set of instruction is configured to cause the processor to:
generate the second set of layout patterns, the second set of layout patterns comprising:
a first layout pattern having a first width;
a second layout pattern having a second width; and
a third layout pattern having a third width,
wherein
the first layout pattern, the second layout pattern, and the third layout pattern of the second set of layout patterns are aligned with different grid lines of the second set of grid lines; and
the first width, the second width, and the third width are different.

15. The layout designing system of claim 10, wherein the set of instruction is configured to cause the processor to:
generate the second set of layout patterns, the second set of layout patterns comprising:
a first layout pattern aligned with the first grid line of the second set of grid lines and having a first width; and a second layout pattern aligned with the second grid line of the second set of grid lines and having a second width different from the first width.

16. The layout designing system of claim 10, wherein the set of instruction is configured to cause the processor to:
place a third set of layout patterns in a third layout layer, the third set of layout patterns extending along a second direction and being aligned with a third cell boundary and a fourth cell boundary of the standard cell layout, the third set of layout patterns corresponding a portion of the second set of components that is configured to be removed by a removal process.

17. An integrated circuit, comprising:
a first set of components in a first component layer extending along a predetermined direction, a first component of the first set of components being aligned with a first cell boundary of a standard cell, and a second component of the first set of components being aligned with a second cell boundary of the standard cell; and
a second set of components in a second component layer extending along the predetermined direction, a first component of the second set of components being aligned with the first cell boundary of the standard cell, and a second component of the second set of components being aligned with the second cell boundary of the standard cell, and wherein the second component layer includes adjacent grid lines, wherein a pitch of first and second adjacent grid lines is different from a pitch of third and fourth adjacent grid lines.

18. The integrated circuit of claim 17, wherein
the first component of the second set of components has a first width; and
a third component of the second set of components has a second width different from the first width, the third component of the second set of components being between the first component of the second set of components and the second component of the second set of components.

19. The integrated circuit of claim 17, wherein the first component layer and the second component layer each correspond to a different one of the following component layers of the integrated circuit:
a fin structure layer for FinFETs;
a first conductive layer over the fin structure layer; and
a second conductive layer over the first conductive layer.

20. The integrated circuit of claim 17, wherein the first component layer and the second component layer each correspond to a different one of the following component layers of the integrated circuit:
a gate structure layer;
a first conductive layer over the gate structure layer; and
a second conductive layer over the first conductive layer.

* * * * *